(12) United States Patent
Matsuo

(10) Patent No.: US 11,159,142 B2
(45) Date of Patent: Oct. 26, 2021

(54) POSITIONS OF RELEASE PORTS FOR SACRIFICIAL LAYER ETCHING

(71) Applicant: SKYWORKS SOLUTIONS, INC., Irvine, CA (US)

(72) Inventor: Nobufumi Matsuo, Suita (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 56 days.

(21) Appl. No.: 16/569,217

(22) Filed: Sep. 12, 2019

(65) Prior Publication Data

US 2020/0091886 A1 Mar. 19, 2020

Related U.S. Application Data

(60) Provisional application No. 62/837,440, filed on Apr. 23, 2019, provisional application No. 62/731,157, filed on Sep. 14, 2018.

(51) Int. Cl.
| | |
|---|---|
| *H03H 9/56* | (2006.01) |
| *H03H 3/02* | (2006.01) |
| *H03H 9/02* | (2006.01) |
| *H03H 9/13* | (2006.01) |

(52) U.S. Cl.
CPC ............. *H03H 9/564* (2013.01); *H03H 3/02* (2013.01); *H03H 9/02047* (2013.01); *H03H 9/02031* (2013.01); *H03H 9/13* (2013.01); *H03H 2003/021* (2013.01)

(58) Field of Classification Search
CPC ............. H03H 9/54–589; H03H 9/02–02157
See application file for complete search history.

(56) References Cited

U.S. PATENT DOCUMENTS

| | | | | |
|---|---|---|---|---|
| 6,714,102 B2* | 3/2004 | Ruby | ..................... | H03H 3/02 181/293 |
| 7,482,738 B2* | 1/2009 | Taniguchi | ................ | H03H 3/02 310/320 |
| 7,639,103 B2* | 12/2009 | Yamakawa | .............. | H03H 3/04 310/349 |
| 8,723,623 B2* | 5/2014 | Hara | ........................ | H03H 3/02 333/189 |
| 10,079,589 B2* | 9/2018 | Lee | ........................ | H03H 9/173 |
| 10,873,316 B2* | 12/2020 | Lee | .................... | H03H 9/02118 |

* cited by examiner

*Primary Examiner* — Dean O Takaoka
*Assistant Examiner* — Alan Wong
(74) *Attorney, Agent, or Firm* — Lando & Anastasi, LLP

(57) ABSTRACT

A film bulk acoustic wave resonator includes a piezoelectric film disposed over a cavity. The cavity is shaped as partial ellipse including first, second, and third vertices. The film bulk acoustic wave resonator further includes three release ports in positions that minimize etch time to remove all sacrificial material from within the cavity.

24 Claims, 14 Drawing Sheets

POSITIONS OF RELEASE PORTS FOR SACRIFICIAL LAYER ETCHING

CROSS-REFERENCE TO RELATED APPLICATIONS

This application claims priority under 35 U.S.C. § 119(e) to U.S. Provisional Patent Application Ser. No. 62/837,440, titled "POSITIONS OF RELEASE PORTS FOR SACRIFICIAL LAYER ETCHING," filed Apr. 23, 2019 and to U.S. Provisional Patent Application Ser. No. 62/731,157, titled "POSITIONS OF RELEASE PORTS FOR SACRIFICIAL LAYER ETCHING," filed Sep. 14, 2018, each of which being incorporated herein by reference in its entirety for all purposes.

BACKGROUND

Technical Field

Embodiments of this disclosure relate to acoustic wave devices and methods for fabricating same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with an aspect disclosed herein, there is provided a film bulk acoustic wave resonator. The film bulk acoustic wave resonator comprises a piezoelectric film disposed over a cavity, the cavity shaped as partial ellipse including first, second, and third vertices, and three release ports in positions that minimize etch time to remove all sacrificial material from within the cavity.

In some embodiments, a first of the release ports is located at an edge of the cavity at a position defined by an intersection of a line perpendicular to a chord between the first and second vertices and extending from a center of the chord between the first and second vertices to the edge of the cavity between the first and second vertices. A second of the release ports may be located at an edge of the cavity at a position between the first and third vertices defined by a center of a second circle having an edge intersecting the third vertex and having a same size as a first circle having a center located at the position of the first release port and an edge intersecting the first and second vertices. A third of the release ports may be located at an edge of the cavity at a position between the second and third vertices defined by a center of a third circle having an edge intersecting the second vertex and having the same size as the first circle. The chord between the first and second vertices may be shorter than a chord between the first and third vertices. The chord between the first and second vertices may be shorter than a chord between the second and third vertices.

In some embodiments, each of the three release ports are in fluid communication with an internal volume of the cavity.

In some embodiments, the resonator further comprises a bottom electrode disposed on a lower side of the piezoelectric film facing the cavity, and a top electrode disposed on an upper side of the piezoelectric film opposite the lower side, wherein at least one of the three release ports are at least partially defined by apertures passing through one or more of the piezoelectric film, the top electrode, or the bottom electrode.

In some embodiments, each of the three release ports have substantially identical cross-sectional areas.

In some embodiments, a boundary of the cavity is defined by an arc extending from the first vertex to the third vertex. The second vertex may be located on the arc.

In some embodiments, a radio frequency filter including a resonator as disclosed herein. The radio frequency filter may be included in an electronics module. The electronics module may be included in an electronic device.

In accordance with another aspect, there is provided a method of forming a film bulk acoustic wave resonator. The method comprises disposing a piezoelectric film over a sacrificial material layer shaped as a partial ellipse including first, second, and third vertices to form a cavity below the piezoelectric film filled with the sacrificial material, forming release ports passing through the piezoelectric film and into the sacrificial material layer, and removing the sacrificial material layer by introducing an etchant for the sacrificial material through the release ports, the release ports being located in positions that minimize etch time to remove all of the sacrificial material.

In some embodiments, forming the release ports includes forming a first release port at a position located at an edge of the cavity defined by an intersection of a line perpendicular to a chord between the first and second vertices and extending from a center of the chord between the first and second vertices to the edge of the cavity between the first and second vertices. Forming the release ports may further include forming a second release port at a position located at an edge of the cavity between the first and third vertices defined by a center of a second circle having an edge intersecting the third vertex and having a same size as a first circle having a center located at the position of the first release port and an edge intersecting the first and second vertices. Forming the release ports may further include forming a third release port at a position located at an edge of the cavity between the second and third vertices defined by a center of a third circle having an edge intersecting the second vertex and having the same size as the first circle. The first, second, and third release ports may be formed by etching.

In some embodiments, the method further comprises removing etch reaction products from the cavity through one or more of the first, second, and third release ports.

In some embodiments, the film bulk acoustic wave resonator comprises a bottom electrode disposed on a lower side of the piezoelectric film facing the cavity, and a top electrode disposed on an upper side of the piezoelectric film opposite the lower side, and the method further comprises forming at least one of the first, second, and third release ports by forming one or more apertures passing through one or more of the piezoelectric film, the top electrode, or the bottom electrode.

In some embodiments, introducing the etchant for the sacrificial material layer through the release ports includes introducing a fluoride containing gas through the release ports. Introducing the etchant for the sacrificial material layer through the release ports may include introducing xenon difluoride gas through the release ports.

In some embodiments, disposing the piezoelectric film over the sacrificial material layer comprises disposing the piezoelectric film over a layer of polysilicon.

In some embodiments, introducing the etchant for the sacrificial material layer through the release ports includes introducing a liquid etchant through the release ports.

In some embodiments, the method further comprises sealing the release ports after removing the sacrificial material layer.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
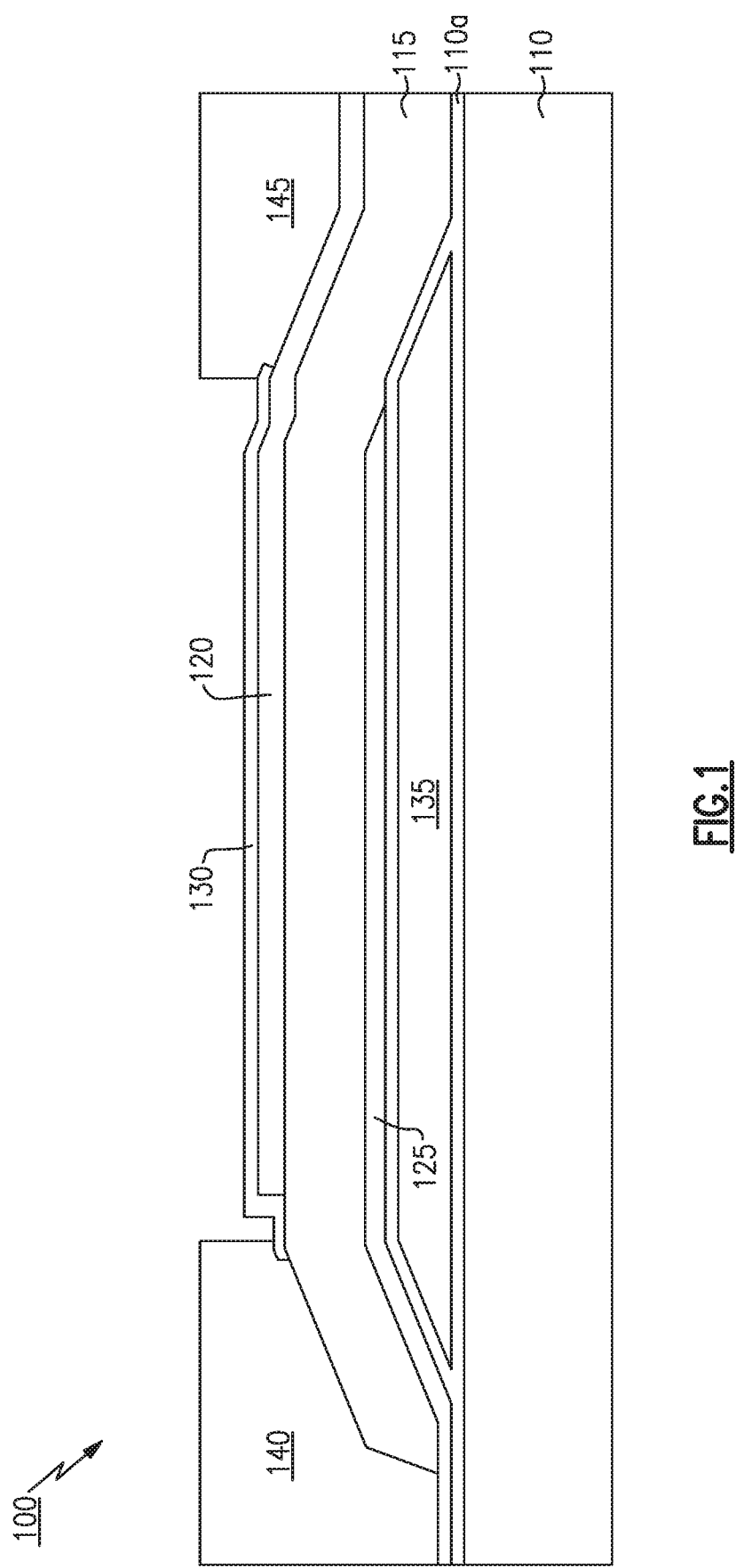
FIG. 1 is a simplified cross-sectional view of an example of a film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material.

FIG. 1 is a simplified cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115 opposite the surface on which the top electrode 120 is disposed. The top electrode 120 may be formed of, for example, ruthenium (Ru). The bottom electrode 125 may be formed of a single layer of material or a dual layer including a layer of Ru disposed in contact with the bottom of the portion of the layer or film of piezoelectric material 115 and a layer of titanium (Ti) disposed on a lower side of the layer of Ru opposite a side of the layer of Ru in contact with the bottom of the portion of the layer or film of piezoelectric material 115. The top electrode 120 and, optionally, the bottom electrode 125 may be covered with a layer of dielectric material 130, for example, silicon dioxide. A cavity 135 is defined beneath the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

It is to be appreciated that references to the relative positions "top" and "bottom" above is intended solely to differentiate these positions from one another. In practice, a FBAR as disclosed herein may be oriented rotated from or upside-down from the orientation illustrated in FIG. 1. Thus, in practice, the top electrode 120 may be oriented to the side of or beneath the bottom electrode 125 depending on the orientation of the FBAR.

Figure 2:
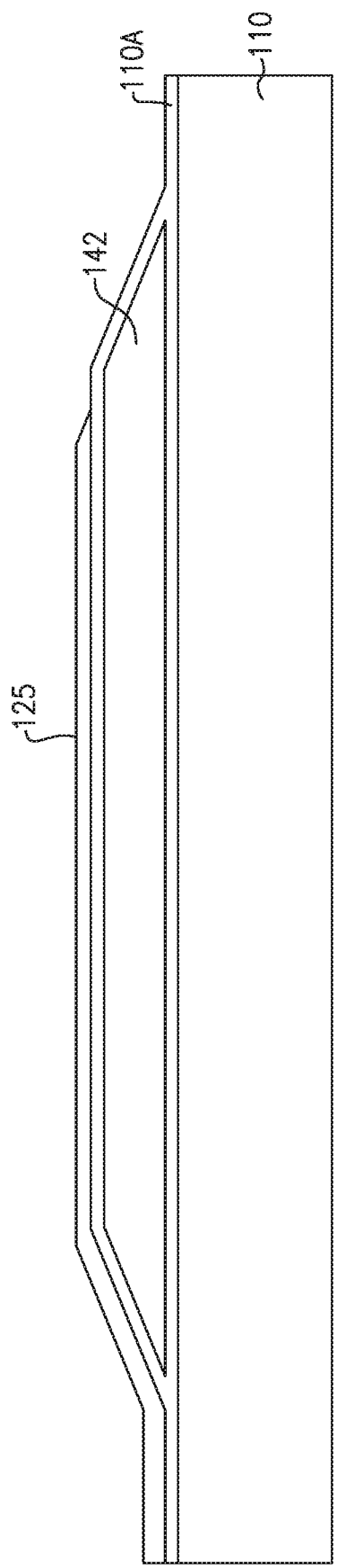
FIG. 2 is a simplified cross-sectional view of a step performed during formation of the example of the film bulk acoustic wave resonator of FIG. 1.
Figure 3:
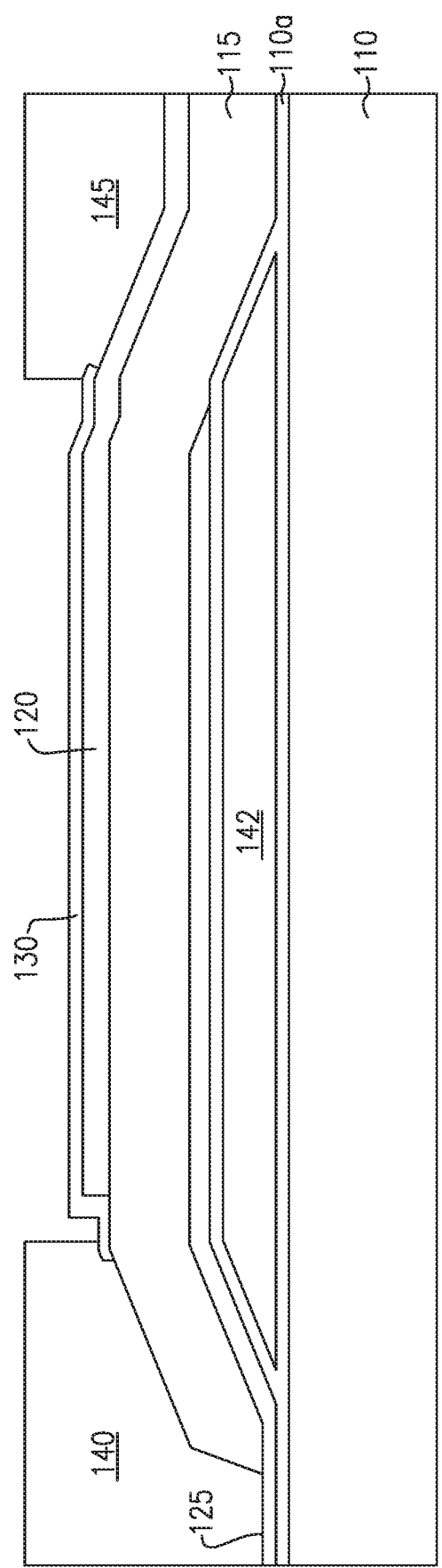
FIG. 3 is a simplified cross-sectional view of another step performed during formation of the example of the film bulk acoustic wave resonator of FIG. 1.

A step in a method of forming a FBAR such as illustrated in FIG. 1 is illustrated in FIG. 2. In a method of forming the FBAR 100, a layer of sacrificial material 142, for example, polysilicon, is deposited on the substrate 110 or on the dielectric surface layer 110A of the substrate and is patterned to have a shape that will later define the cavity 135. As illustrated in FIG. 2, the bottom electrode 125 is deposited on the layer of sacrificial material 142, optionally on top of a layer of silicon dioxide 10A that is formed on the upper surface of the layer of sacrificial material 142. As illustrated in FIG. 3, the additional layers that make up the FBAR 100, including the or film of piezoelectric material 115, the top electrode 120, the layer of dielectric material 130, and the bottom and top electrical contacts 140, 145 are also deposited.

In the structure illustrated in FIG. 3, the layer of sacrificial material 142 is still present below the film of piezoelectric material 115 and the lower electrode 125. To form the cavity 135 so that the film of piezoelectric material 115 is free to vibrate, the layer of sacrificial material is removed.

Figure 4:
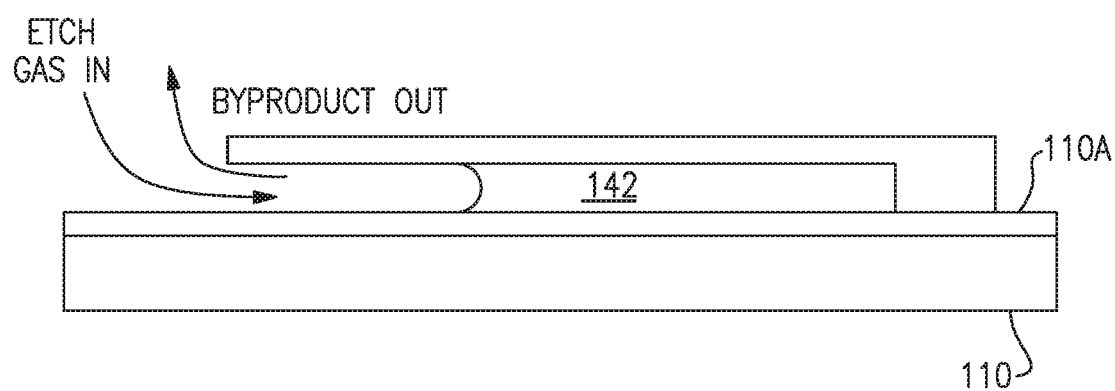
FIG. 4 schematically illustrates another step performed during formation of the example of the film bulk acoustic wave resonator of FIG. 1.
Figure 5:
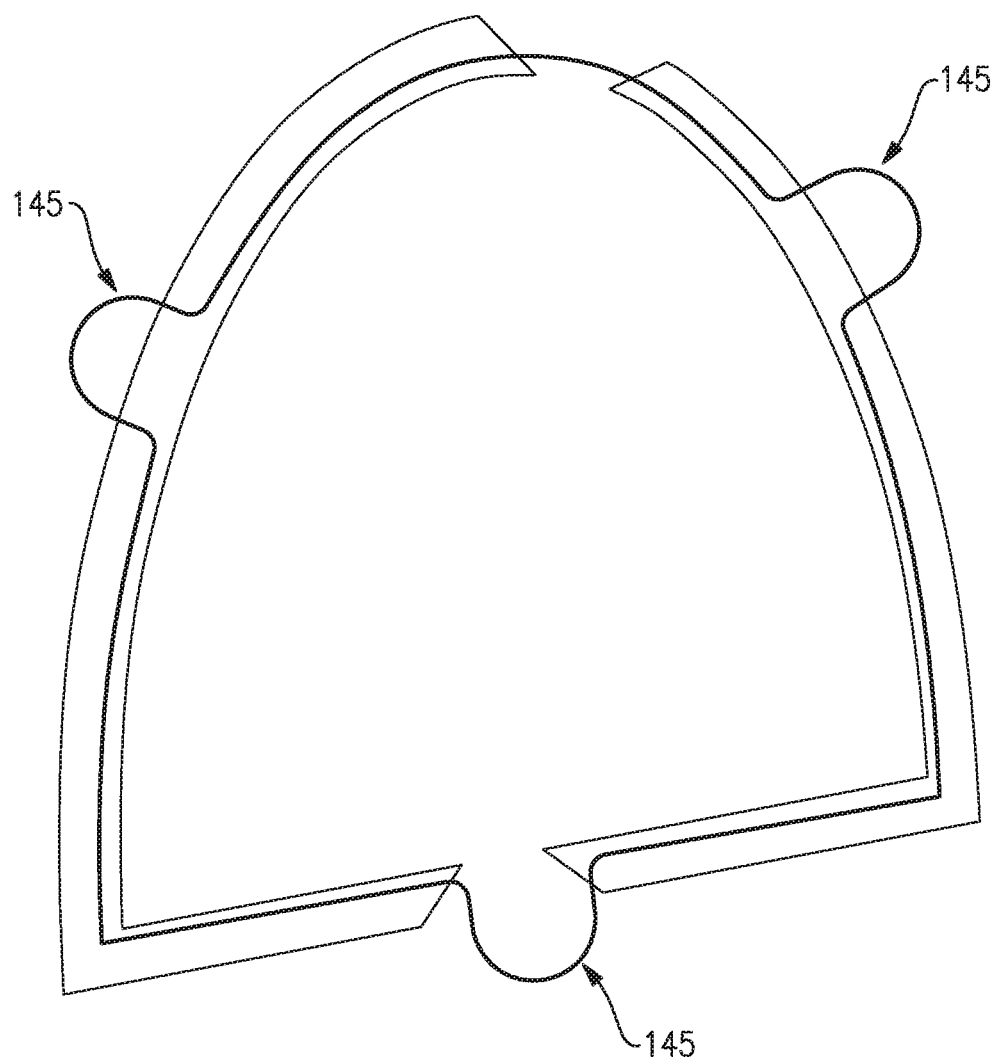
FIG. 5 illustrates the positions of release ports in an example of a film bulk acoustic wave resonator.

A method of removing the layer of sacrificial material 142 is illustrated schematically in FIG. 4. To remove the layer of sacrificial material, one or more apertures 145 are etched through a portion or portions of the FBAR 100 above the layer of sacrificial material 142. The one or more apertures 145 may be etched through the film of piezoelectric material 115, the top electrode 120, and the bottom electrode 125 or a subset of these, depending on the shape of these structures and the location of the one or more apertures 145. The one or more apertures 145 are typically etched at locations at the periphery of the FBAR 100. The one or more apertures 145 may have identical or substantially similar cross-sectional areas or diameters. The one or more apertures 145 may have diameters of between about 10 μm and about 50 μm, for example, about 24 μm. The one or more apertures 145 are desirably located at or proximate edges of the FBAR device cavity to reduce any effect on propagation of mechanical waves through the layers of the FBAR device, for example, the film of piezoelectric material 115. FIG. 5 illustrates a plan view of an embodiment of a FBAR with a partial elliptical shape and three apertures 145 etched at different locations about the periphery of the FBAR.

Once the one or more apertures 145 are formed the layer of sacrificial material 142 is removed by etching. In some embodiments, an etchant gas, for example, a fluoride containing gas such as xenon difluoride (XeF$_2$) is utilized to etch away the layer of sacrificial material 142. The gas is introduced through the one or more apertures 145, reacts with the material of the layer of sacrificial material 142, and gaseous reactant products exit back out through the one or more apertures 145. The one or more apertures 145 thus may be referred to as "release ports." The etching reaction may occur according to the following formula:

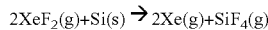

$$2XeF_2(g) + Si(s) \rightarrow 2Xe(g) + SiF_4(g)$$

In other embodiments, a liquid etchant, for example, a hydrofluoric acid containing solution may be used to etch away the layer of sacrificial material 142 in addition to or as an alternative to a gaseous etchant.

Applicant has appreciated that the amount of etchant used and the processing time to remove the layer of sacrificial material 142 may be minimized by judicious placement of the release ports 145. The gas-based or liquid-based etching of the layer of sacrificial material 142 is typically isotropic. The area of the layer of sacrificial material 142 that is etched may thus be approximated by circles centered on the release ports 145 that grow radially in size in a linear relationship with time. An optimal location of the release ports 145 may thus be one such that the size of circles about each release port 145, each having the same radius, is minimized while the circles cover the entire area of the layer of sacrificial material 142. A method of determining the optimal location of three release ports 145 in a FBAR shaped as a partial ellipse will be described with reference to FIGS. 6A-6C. It has been determined that three release ports 145 is typically an optimal number of release ports 145 for removing the layer of sacrificial material 145 from a FBAR shaped as a partial ellipse. In some embodiments, four or five release ports may be formed in larger resonators to compensate the etching amount through one release port. In some embodiments, smaller resonators may have surface areas of less than about 5,000 μm$^2$, medium size resonators may have surface areas of between about 5,000 μm$^2$ and about 15,000 μm$^2$, and larger resonators may have surface areas of 15,000 μm$^2$ or greater. Too great a number of release ports, however may degrade reliability of an FBAR device because portions of the device with release ports may be structurally weaker than portions without release ports due to the lack of piezoelectric material and metal in the portions of the device with release ports.

Figure 6A:
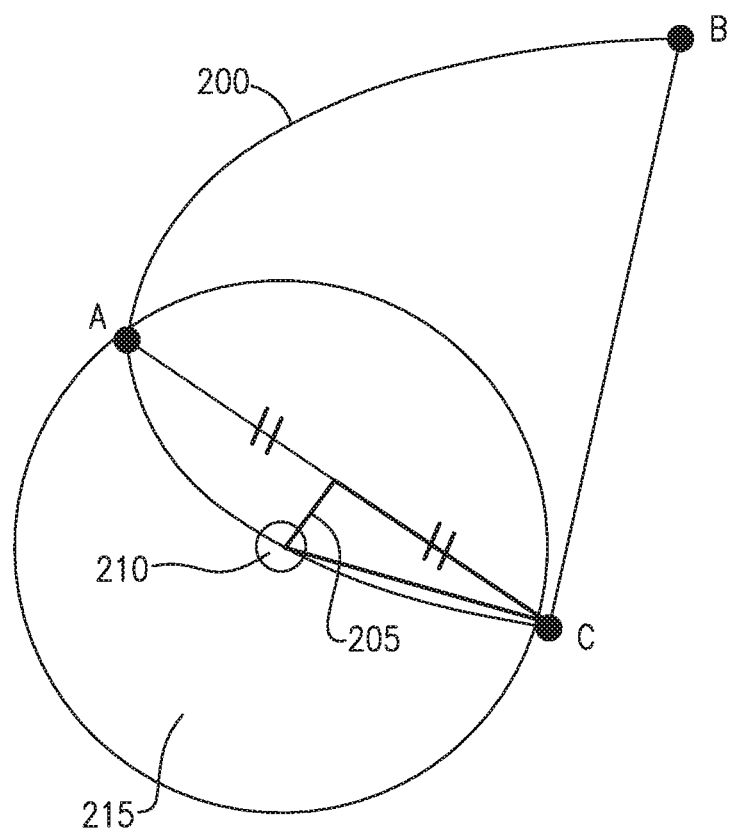
FIG. 6A illustrates a first step in a method of identifying locations for release ports in an example of a film bulk acoustic wave resonator.

As illustrated in FIG. 6A vertices of a partial ellipse 200 representing the boundaries of the layer of sacrificial material 142 in a FBAR are identified. These vertices are indicated at "A," "B," and "C" in FIG. 6A. A line 205 is drawn at the midpoint of the shorter chord and perpendicular to the shorter chord joining vertex A with one of vertices B or C (AB or AC, in the example illustrated in FIG. 6A, chord AC is shorter). The intersection of the line 205 and the arc of the partial ellipse 200 between the vertices defining the shorter chord AC defines the location 210 of the first release port 145. The illustrated circle 215 is the smallest circle centered on the location 210 that would fill the area from vertex A to vertex C.

To determine the optimal location 220 of the second release port 145 a second circle 225 having the same size as the first circle 215 is positioned with a perimeter of the circle 225 located at vertex B and the center of the second circle 225 located on the line segment BC between vertices B and C. (See FIG. 6B.) The optimal location 220 of the second release port 145 is the location of the center of the second circle 225.

To determine the optimal location 230 of the third release port 145 a third circle 235 having the same size as the first circle 215 is positioned with a perimeter of the circle 235 located at vertex A and the center of the third circle 225 located on the arc of the partial ellipse 200 between vertices A and B. (See FIG. 6C.) The optimal location 230 of the third release port 145 is the location 230 of the center of the third circle 235.

The release ports are etched at the optimal locations 210, 220, 230. In some embodiments, over-etching of the sacrificial material layer 142 may be desired to ensure the layer of sacrificial material 142 is removed at locations where perimeters of the circles 215, 225, 235 closely approach the boundary of the partial ellipse 200, for example, the areas indicated at 240 and 245 in FIG. 6D.

Figure 6B:
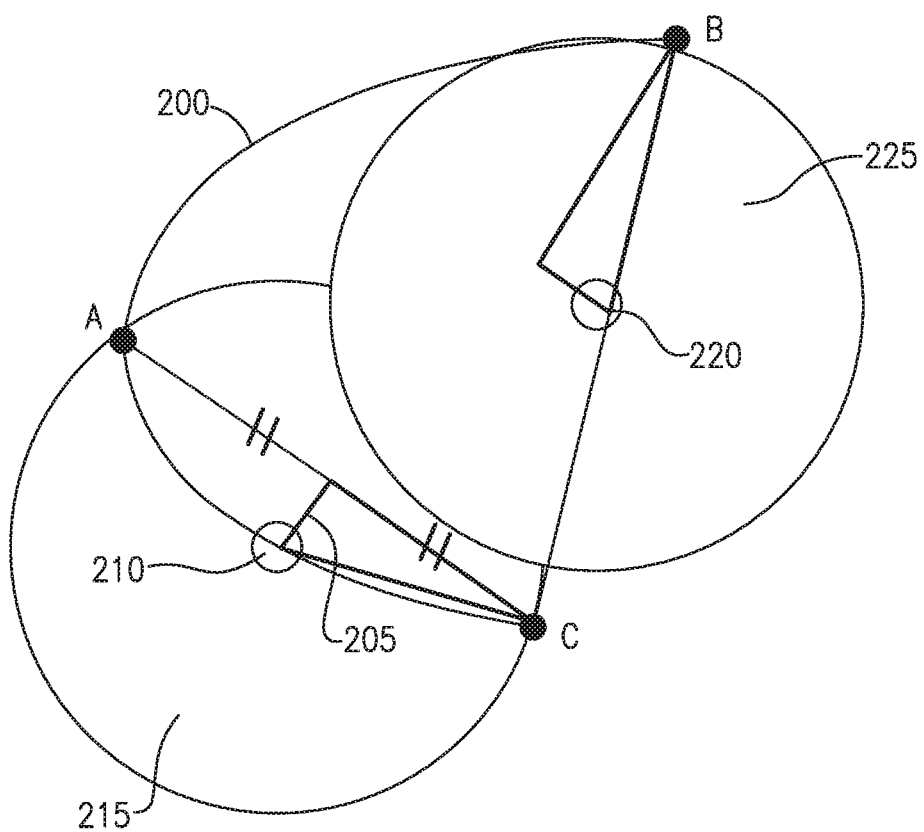
FIG. 6B illustrates a second step in a method of identifying locations for release ports in an example of a film bulk acoustic wave resonator.
Figure 6C:
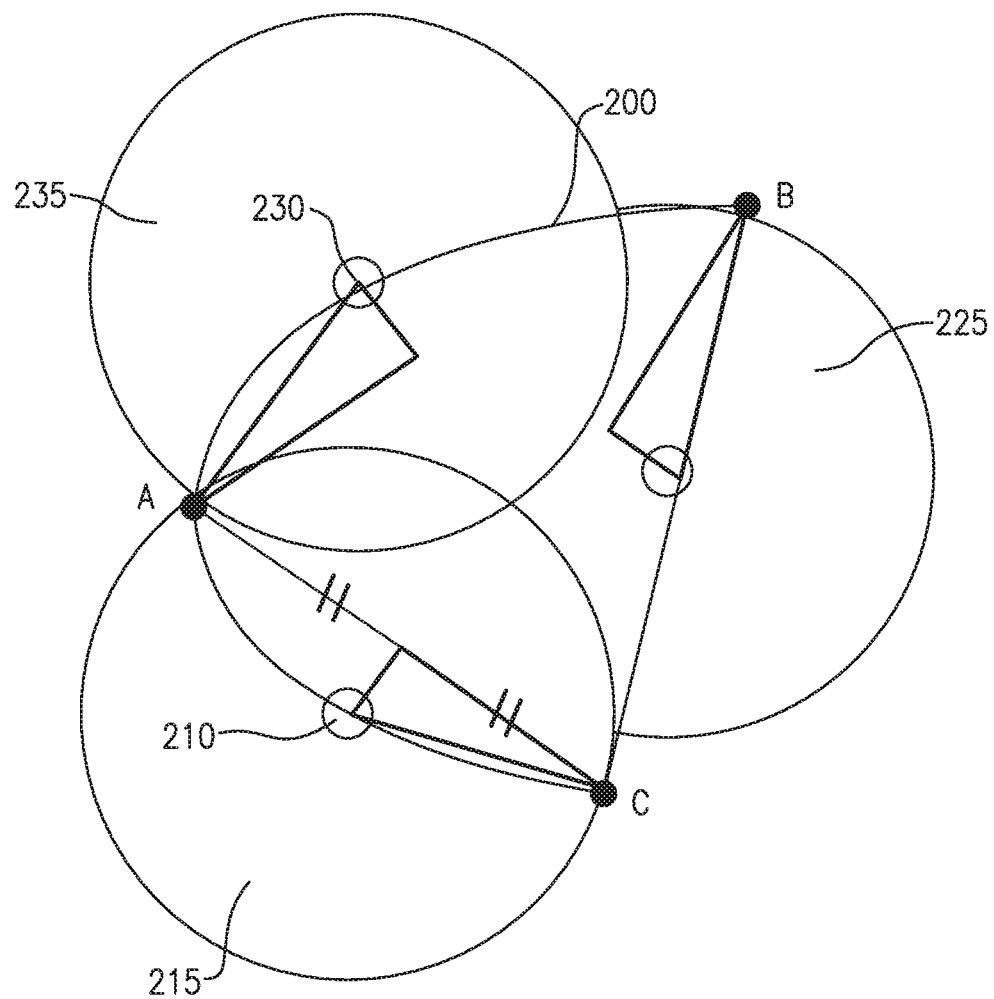
FIG. 6C illustrates a third step in a method of identifying locations for release ports in an example of a film bulk acoustic wave resonator.
Figure 6D:
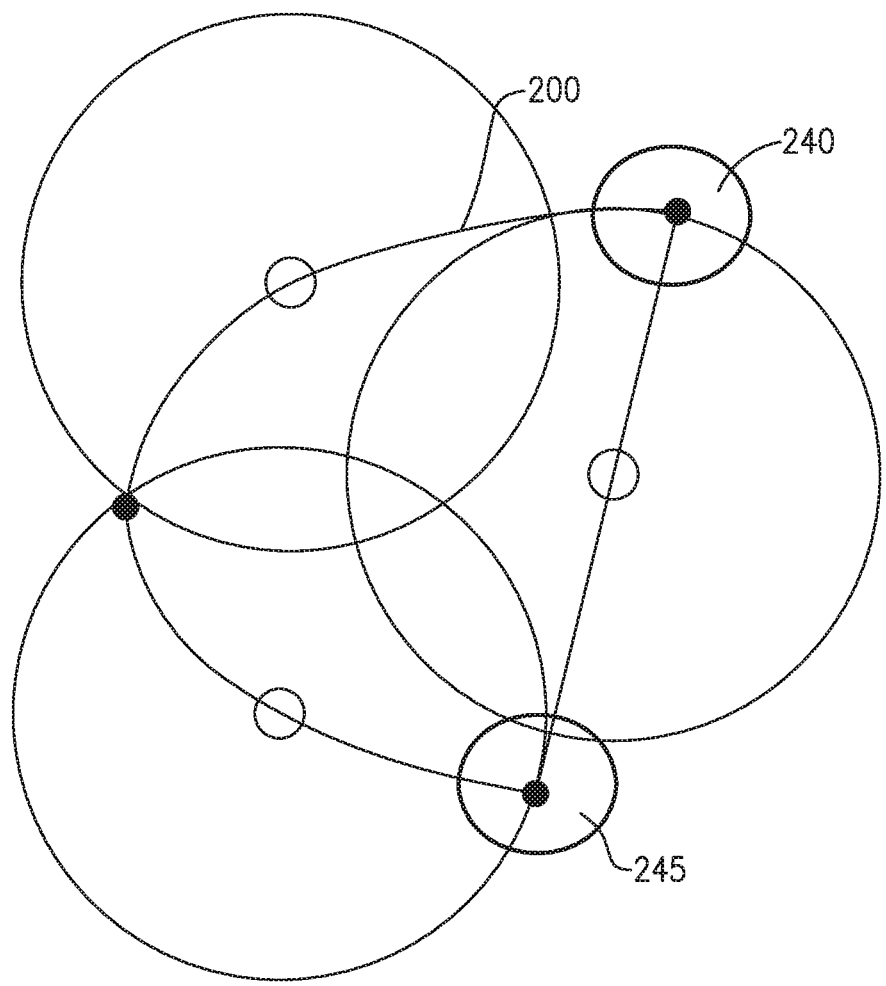
FIG. 6D illustrates locations in a film bulk acoustic wave resonator in which over-etching of a sacrificial material layer may be desired.
Figure 7A:
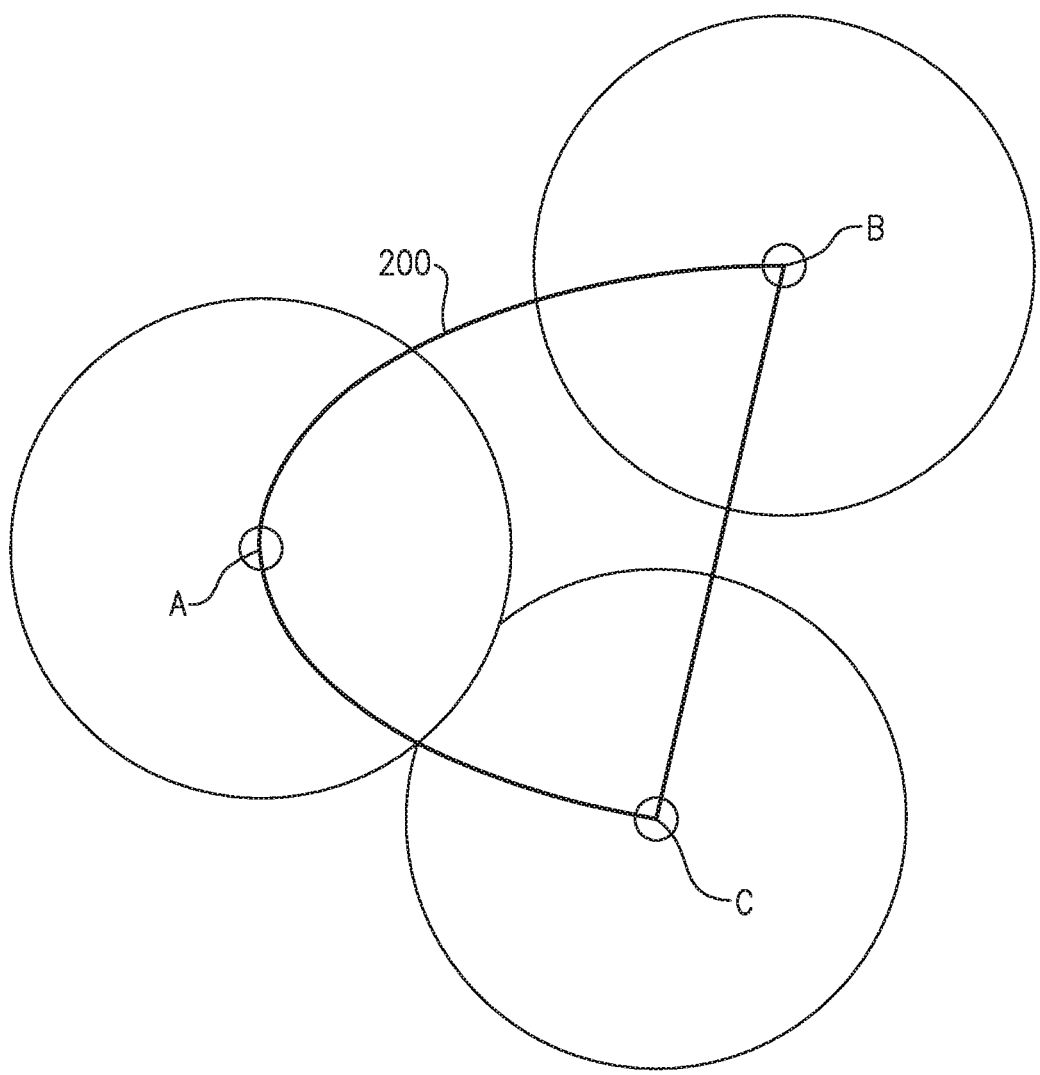
FIG. 7A is a comparative example illustrating locations of release ports in an example of a film bulk acoustic wave resonator selected utilizing a first alternative method.
Figure 7B:
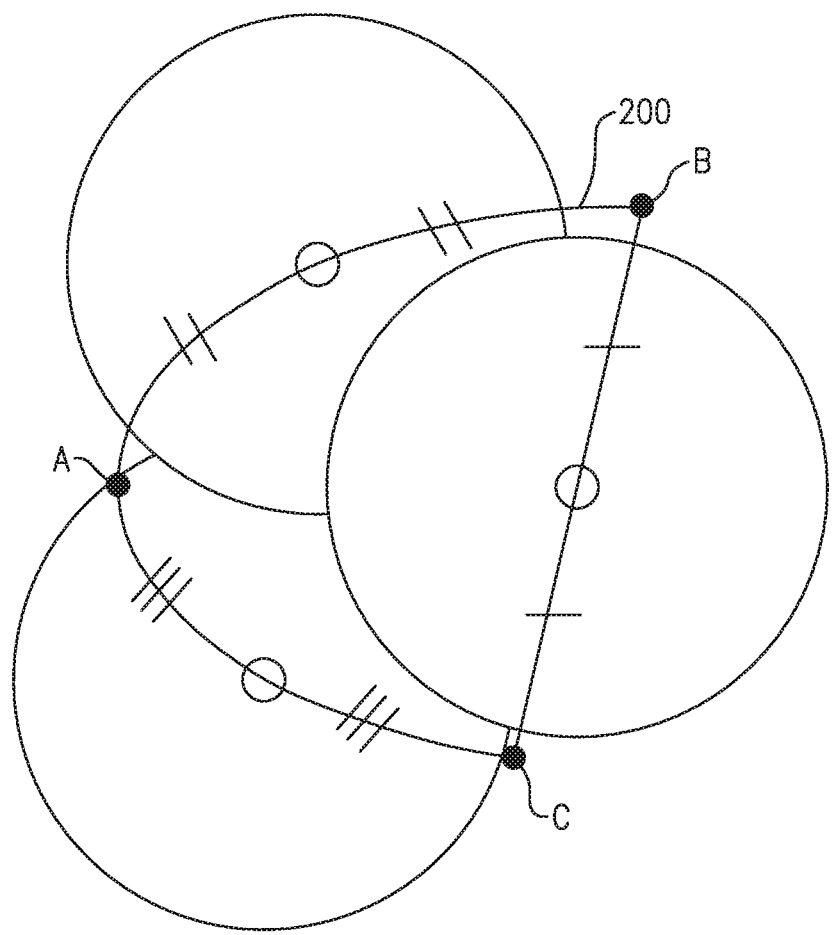
FIG. 7B is a comparative example illustrating locations of release ports in an example of a film bulk acoustic wave resonator selected utilizing a second alternative method.

FIG. 7A illustrates a comparative example in which the release ports are located at each vertex A, B, C, of the partial ellipse 200 representing the boundaries of the layer of sacrificial material 142 in a FBAR and FIG. 7B illustrates a comparative example in which the release ports are located at midpoints between each of the pairs of vertices of the partial ellipse 200. Circles having the same size as circles 215, 225, 235 in FIGS. 6A-6C are drawn centered on each of the alternative release port locations in each of FIGS. 7A and 7B. The combination of circles in FIGS. 7A and 7B do not cover the full area within the partial ellipse 200, which indicates that a greater amount of time and a greater amount of etchant material would be used to fully remove the layer of sacrificial material 142 if the release ports were located in the positions indicated in FIG. 7A or 7B rather than the positions indicated in FIG. 6C.

Figure 8:
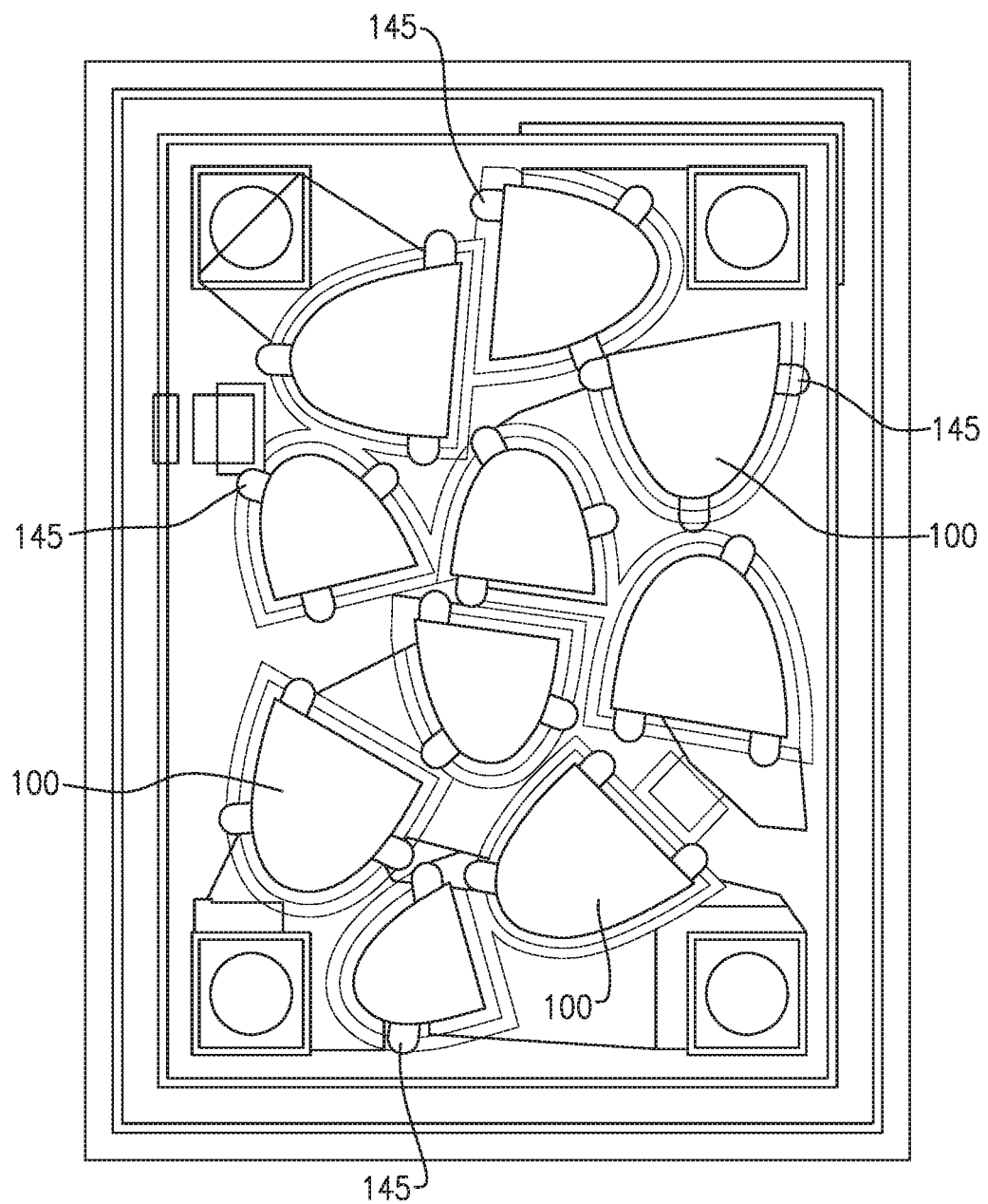
FIG. 8 illustrates relative locations of film bulk acoustic resonators in an example device.

It is to be appreciated that due to the relative locations of FBARs in an actual device, as illustrated in the example of FIG. 8, it may not always be possible to position the release ports 145 at the optimal locations, and in some instances, two rather than three release ports may be utilized.

Figure 9:
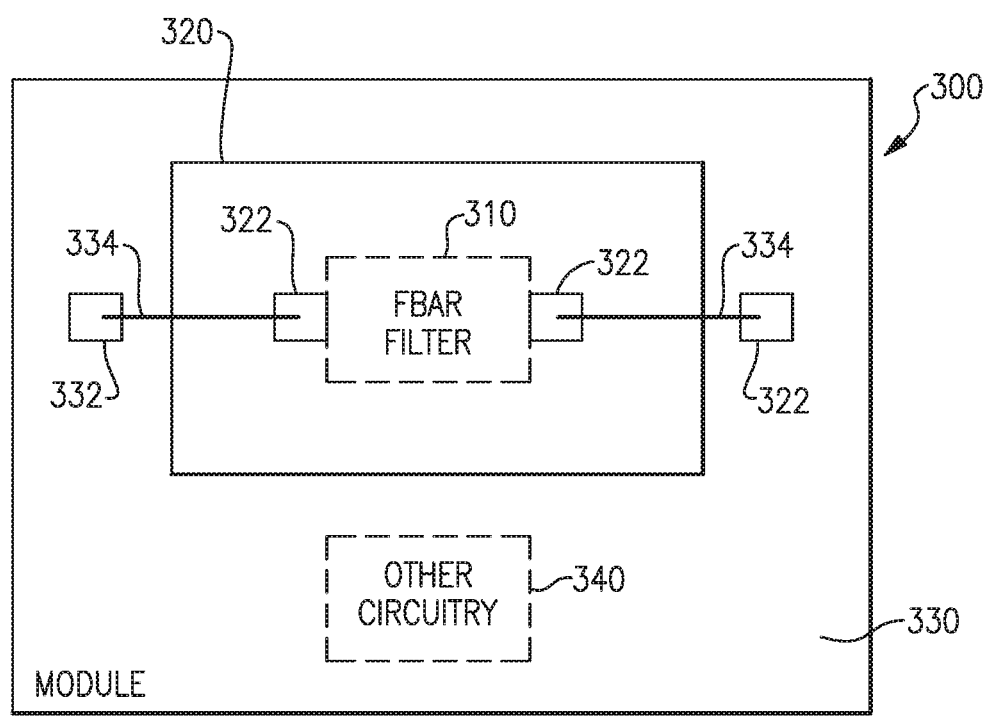
FIG. 9 is a block diagram of one example of a filter module that can include one or more film bulk acoustic wave resonator elements according to aspects of the present disclosure.
Figure 10:
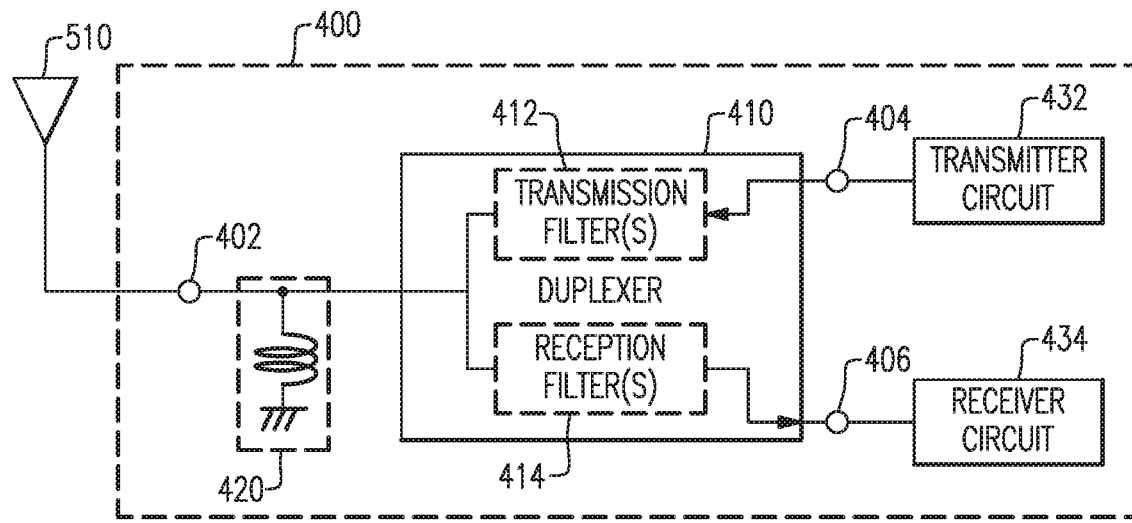
FIG. 10 is a block diagram of one example of a front-end module that can include one or more filter modules according to aspects of the present disclosure.
Figure 11:
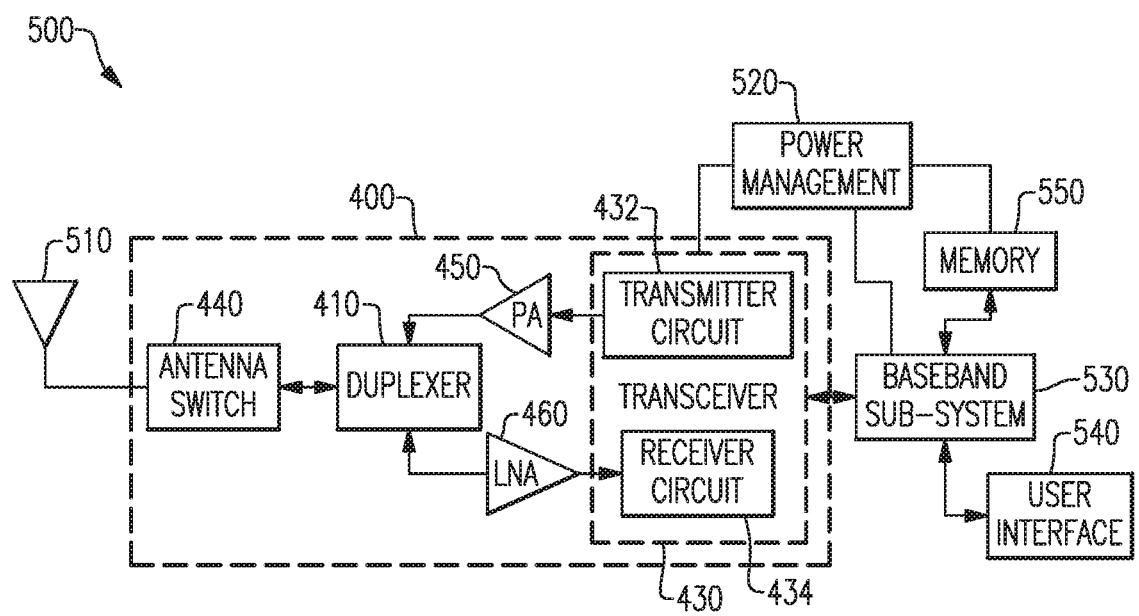
FIG. 11 is a block diagram of one example of a wireless device including the front-end module of FIG. 10.

The acoustic wave devices discussed herein can be implemented in a variety of packaged modules. Some example packaged modules will now be discussed in which any suitable principles and advantages of the packaged acoustic wave devices discussed herein can be implemented. FIGS. 9, 10, and 11 are schematic block diagrams of illustrative packaged modules and devices according to certain embodiments.

As discussed above, embodiments of the FBAR elements disclosed herein can be configured as or used in filters, for example. In turn, a FBAR filter using one or more FBAR elements may be incorporated into and packaged as a module that may ultimately be used in an electronic device, such as a wireless communications device, for example. FIG. 9 is a block diagram illustrating one example of a module 300 including a FBAR filter 310. The FBAR filter 310 may be implemented on one or more die(s) 320 including one or more connection pads 322. For example, the FBAR filter 310 may include a connection pad 322 that corresponds to an input contact for the FBAR filter and another connection pad 322 that corresponds to an output contact for the FBAR filter. The packaged module 300 includes a packaging substrate 330 that is configured to receive a plurality of components, including the die 320. A plurality of connection pads 332 can be disposed on the packaging substrate 330, and the various connection pads 322 of the FBAR filter die 320 can be connected to the connection pads 332 on the packaging substrate 330 via electrical connectors 334, which can be solder bumps or wirebonds, for example, to allow for passing of various signals to and from the FBAR filter 310. The module 300 may optionally further include other circuitry die 340, such as, for example one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the FBAR filter 310 can be used in a wide variety of electronic devices. For example, the FBAR filter 310 can be used in an antenna duplexer, which itself can be incorporated into a variety of electronic devices, such as RF front-end modules and communication devices.

Referring to FIG. 10, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the FBAR filter 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 10, however in other embodiments these components may be integrated into a common transceiver circuit or module. As will be appreciated by those skilled in the art, the front-end module 400 may include other components that are not illustrated in FIG. 10 including, but not limited to, switches, electromagnetic couplers, amplifiers, processors, and the like.

FIG. 11 is a block diagram of one example of a wireless device 500 including the antenna duplexer 410 shown in FIG. 10. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 10. The front-end module 400 includes the duplexer 410, as discussed above. In the example shown in FIG. 11 the front-end module 400 further includes an antenna switch 440, which can be configured to switch between different frequency bands or modes, such as transmit and receive modes, for example. In the example illustrated in FIG. 11, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 10.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 11, the front-end module 400 may further include a low noise amplifier module 460, which amplifies received signals from the antenna 510 and provides the amplified signals to the receiver circuit 434 of the transceiver 430.

The wireless device 500 of FIG. 11 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A film bulk acoustic wave resonator comprising:
 a piezoelectric film disposed over a cavity, the cavity shaped as partial ellipse including first, second, and third vertices; and
 three release ports in positions that minimize etch time to remove essentially all sacrificial material from within the cavity, a first of the release ports being located at an edge of the cavity at a first position defined by an intersection of the edge of the cavity and a line perpendicular to a chord between the first and second vertices and extending from a center of the chord between the first and second vertices to the edge of the cavity between the first and second vertices.

2. The resonator of claim 1 wherein a second of the release ports is located at an edge of the cavity at a second position between the first and third vertices defined by a center of a second circle having an edge intersecting the third vertex and having a same size as a first circle having a center located at the first position of the first release port and an edge intersecting the first and second vertices.

3. The resonator of claim 2 wherein a third of the release ports is located at an edge of the cavity at a third position between the second and third vertices defined by a center of a third circle having an edge intersecting the second vertex and having the same size as the first circle.

4. The resonator of claim 3 wherein the chord between the first and second vertices is shorter than a chord between the first and third vertices.

5. The resonator of claim 4 wherein the chord between the first and second vertices is shorter than a chord between the second and third vertices.

6. The resonator of claim 1 wherein each of the three release ports are in fluid communication with an internal volume of the cavity.

7. The resonator of claim 1 further comprising a bottom electrode disposed on a lower side of the piezoelectric film facing the cavity, and a top electrode disposed on an upper side of the piezoelectric film opposite the lower side, wherein at least one of the three release ports are at least partially defined by apertures passing through one or more of the piezoelectric film, the top electrode, or the bottom electrode.

8. The resonator of claim 1 wherein each of the three release ports have substantially identical cross-sectional areas.

9. The resonator of claim 1 wherein a boundary of the cavity is defined by an arc extending from the first vertex to the third vertex.

10. The resonator of claim 9 wherein the second vertex is located on the arc.

11. A radio frequency filter including the resonator of claim 1.

12. An electronics module including the radio frequency filter of claim 11.

13. An electronic device including the electronics module of claim 12.

14. A method of forming a film bulk acoustic wave resonator comprising:
  disposing a piezoelectric film over a sacrificial material layer shaped as a partial ellipse including first, second, and third vertices to form a cavity below the piezoelectric film filled with the sacrificial material;
  forming three release ports passing through the piezoelectric film and into the sacrificial material layer, forming the three release ports including forming a first release port at a first position located at an edge of the cavity defined by an intersection of a line perpendicular to a chord between the first and second vertices and extending from a center of the chord between the first and second vertices to the edge of the cavity between the first and second vertices; and
  removing the sacrificial material layer by introducing an etchant for the sacrificial material through the three release ports, the three release ports being located in positions that minimize etch time to remove essentially all of the sacrificial material.

15. The method of claim 14 wherein forming the three release ports further includes forming a second release port at a second position located at an edge of the cavity between the first and third vertices defined by a center of a second circle having an edge intersecting the third vertex and having a same size as a first circle having a center located at the first position of the first release port and an edge intersecting the first and second vertices.

16. The method of claim 15 wherein forming the three release ports further includes forming a third release port at a third position located at an edge of the cavity between the second and third vertices defined by a center of a third circle having an edge intersecting the second vertex and having the same size as the first circle.

17. The method of claim 16 wherein the first, second, and third release ports are formed by etching.

18. The method of claim 16 further comprising removing etch reaction products from the cavity through one or more of the first, second, and third release ports.

19. The method of claim 16 wherein the film bulk acoustic wave resonator comprises a bottom electrode disposed on a lower side of the piezoelectric film facing the cavity, and a top electrode disposed on an upper side of the piezoelectric film opposite the lower side, and the method further comprises forming at least one of the first, second, and third release ports by forming one or more apertures passing through one or more of the piezoelectric film, the top electrode, or the bottom electrode.

20. The method of claim 14 wherein introducing the etchant for the sacrificial material layer through the release ports includes introducing a fluoride containing gas through the release ports.

21. The method of claim 20 wherein introducing the etchant for the sacrificial material layer through the release ports includes introducing xenon difluoride gas through the release ports.

22. The method of claim 14 wherein disposing the piezoelectric film over the sacrificial material layer comprises disposing the piezoelectric film over a layer of polysilicon.

23. The method of claim 14 wherein introducing the etchant for the sacrificial material layer through the release ports includes introducing a liquid etchant through the release ports.

24. The method of claim 14 further comprising sealing the release ports after removing the sacrificial material layer.

* * * * *